United States Patent [19]

Hales

[11] Patent Number: 5,036,302
[45] Date of Patent: Jul. 30, 1991

[54] RADIO RECEIVER FILTER WITH IMAGE REJECTION

[75] Inventor: Jeffrey E. Hales, Keysborough, Australia

[73] Assignee: U.S. Philips Corporation, New York, N.Y.

[21] Appl. No.: 539,094

[22] Filed: Jun. 15, 1990

[30] Foreign Application Priority Data

Jun. 19, 1989 [AU] Australia ............................. PJ4812

[51] Int. Cl.$^5$ ............................................. H01P 1/20
[52] U.S. Cl. ................................... 333/202; 333/176; 455/286
[58] Field of Search ................ 333/202, 219, 174–176; 334/41, 42; 455/284, 286, 290, 339, 340, 302, 307

[56] References Cited

U.S. PATENT DOCUMENTS 3,939,443  2/1976  Biró et al. ........................... 333/202
4,490,699  12/1984  Yanagida ............................. 333/202

FOREIGN PATENT DOCUMENTS 0140901  7/1985  Japan .................................... 333/202
0092602  4/1987  Japan .................................... 333/202

Primary Examiner—Eugene R. Laroche
Assistant Examiner—Seung Ham
Attorney, Agent, or Firm—David R. Treacy

[57] ABSTRACT

A band pass filter for radio frequencies uses helical resonators arranged to have a transmission notch on the high frequency side of the pass band. A plurality of resonators housed in a shield are formed by quarter-wavelength transmission lines wound in a helix, with adjacent resonators being wound in opposite directions and grounded at opposite ends to provide a transmission notch at the high frequency side of the passband. One or more grounded shielding pins are arranged between adjacent resonators to adjust the frequency of the notch to be at or near an image frequency. The grounded end of each of the resonators may be coupled to a varicap diode network for electronically tuning the filter.

16 Claims, 3 Drawing Sheets

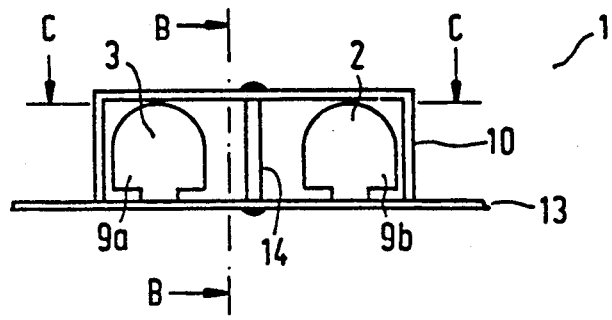
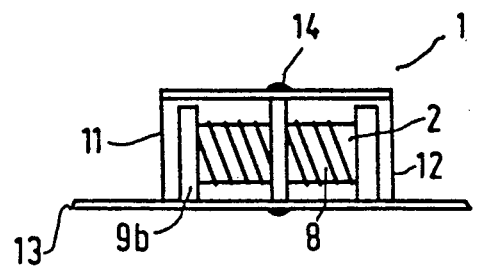
FIG.1A FIG.1B
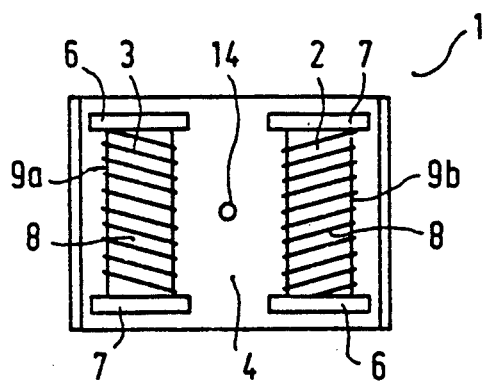
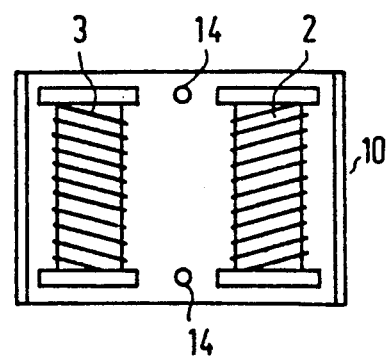
FIG.1C FIG. 2

RADIO RECEIVER FILTER WITH IMAGE REJECTION

BACKGROUND OF THE INVENTION

The present invention relates to a radio receiver having a front end filter comprising helical resonators.

The use of filters having helical resonators in radio frequency applications represents a well known technology. These devices can be used in the 10 MHz to 1.5 GHz region with typical Q's from 200 to 5000. Currently such devices are being used as high Q bandpass filters, band rejection filters, reference cavities, tuning elements for oscillators, front end filters for receivers, and for many other applications where high Q is paramount and large size prohibitive. A conventional helical filter consists of a number of helical resonators enclosed in a rectangular or circular shield, each consisting of a quarter-wavelength transmission line wound in the form of a single layer helix on a circular former, the helical transmission lines being wound in the same direction, short-circuited at the same end (to the shield) and open circuited at the other. The resonators are coupled to each other via openings in partitions between them, the size and location of the openings affecting the coupling coefficient between the resonators and thereby the frequency response of the filter. A more detailed discussion on helical filters can be found in A. I. Zverev's "Handbook of Filter Synthesis". Wiley and Sons 1967.

A disadvantage of using conventional helical resonators in the front end filter of a radio receiver is that in order to obtain satisfactory image frequency rejection many conventional helical resonators are needed, involving significant costs. A further disadvantage of using conventional helical resonators is that the amount of coupling is controlled by the size and location of the openings in the partitions which must be accurately machined, again involving significant costs.

SUMMARY OF THE INVENTION

It is an object of the present invention to overcome the above disadvantages.

According to the invention a radio receiver comprises a filter having one or more filter sections, each filter section comprising a shield having therein a plurality of helical resonators each having a quarter-wavelength transmission line wound in the form of a helix with the transmission lines of adjacent resonators being wound in opposite directions and being grounded at opposite ends, whereby the frequency response of the filter section has a transmission notch on the high frequency side of the filter section passband. One or more grounded shielding pins are disposed between adjacent helical resonators at such locations that the transmission notch in the frequency response of the filter section is steered to be coincident with or near to the image frequency.

The present invention is based on the recognition that by using such a filter section as distinct from one using conventional helical resonators a transmission notch is generated on the high frequency side of the passband and that by steering the transmission notch in the frequency response to be coincident with or near to the image frequency, extra image frequency rejection is gained. As a consequence a reduced number of helical resonators may be utilised to obtain the required image frequency rejection than if conventional helical resonators were used. Moreover the use of shielding pins avoids the costs that are associated with the use of partitions in conventional helical resonators.

In a preferred embodiment of the invention, the filter comprises two said filter sections, the output of one being coupled to the input of the other, and each filter section having two said helical resonators. This receiver which is suitable for operation in the VHF band, uses a limited number of helical resonators as compared with a conventional receiver.

In further preferred embodiment of the invention, each of the filter sections comprises one shielding pin which is disposed between said adjacent helical resonators at a central location. It has been found that by using a central shielding pin the receiver is suitable for operation over the band (146 MHz–174 MHz), with the central location of the shielding pin steering the transmission notch near to the image frequency.

In a further embodiment of the invention, each of the filter section comprises two shieldings pins which are disposed between said adjacent helical resonators, the shielding pins being located at opposite ends of the adjacent resonators. It has been found that this filter is suitable for operation over the band (68 MHz–88 MHz), with the configuration of the shielding pins steering the transmission notch near to the image frequency.

In a further preferred embodiment of the invention, the output of one filter section is coupled to the input of another filter section via an amplifier. This embodiment has the advantage that the S/N ratio of the output signal of the first filter section does not significantly deteriorate beyond the amplifier.

In another preferred embodiment of the invention, the open circuited end of each of the helical resonators is coupled to a varicap diode network whereby the filter can be electronically tuned. This embodiment provides a receiver with a wide tuning range end ensures good image rejection over the passband.

Embodiments of the invention will now be described in more detail, by way of non-limitative example, with reference to the accompanying drawings.

BRIEF DESCRIPTION OF THE DRAWING

FIG. 1A is a side view of a filter section having two helical resonators in accordance with the invention.

FIG. 1B is a view of section B—B of the filter section shown in FIG. 1A.

FIG. 1C is a view of section C—C of the filter section shown in FIG. 1A.

FIG. 2 is a sectional view similar to FIG. 1C of a further embodiment of the invention.

DESCRIPTION OF THE PREFERRED EMBODIMENTS

Figure 3:
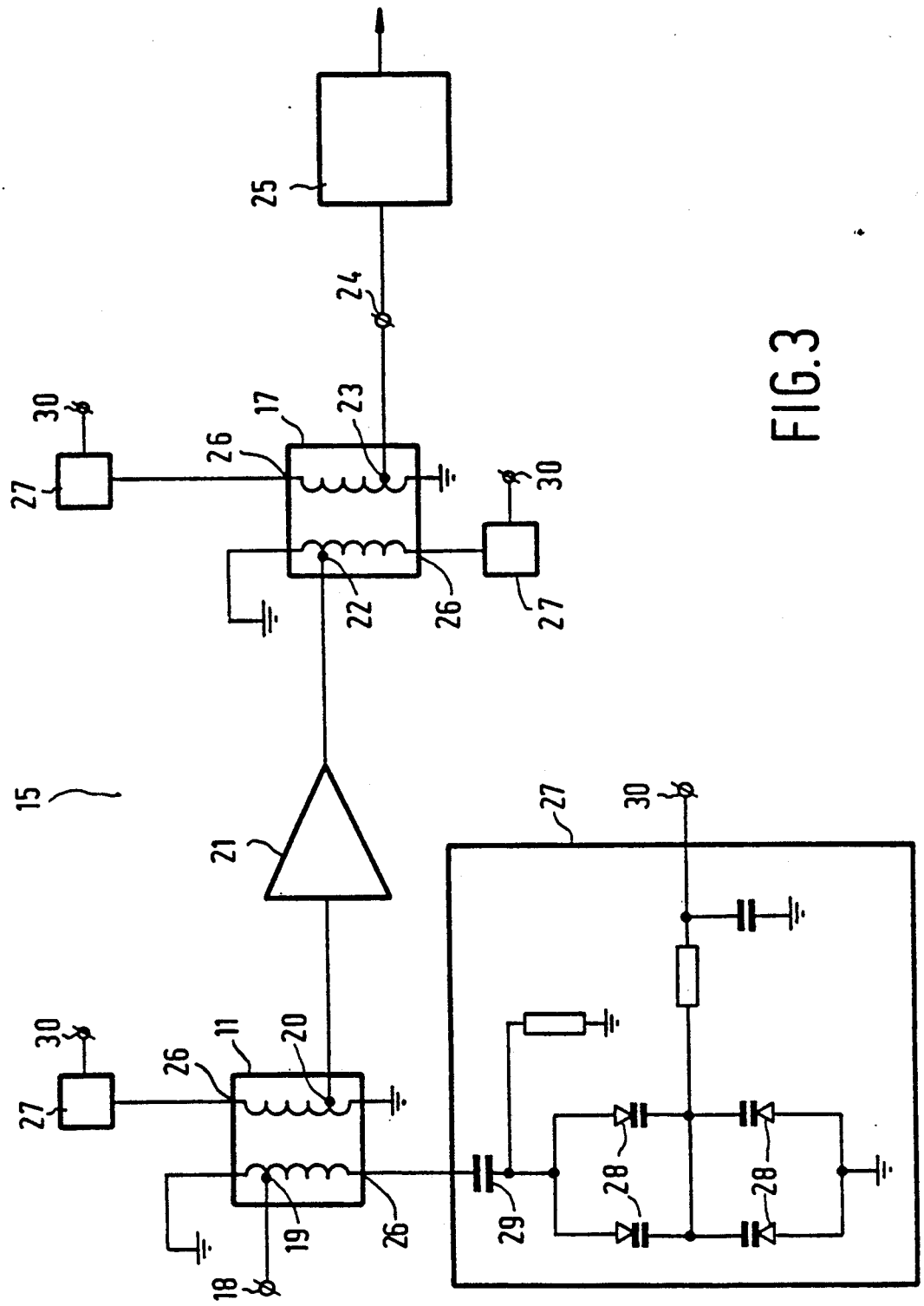
FIG. 3 is a electrical schematic diagram showing a front-end of a radio receiver in accordance with the invention.

The filter section 1 shown in FIGS. 1A, 1B, 1C has its application in a VHF radio receiver front-end for operation over the band (146–174 MHz), the radio receiver front-end being illustrated in FIG. 3. The filter section 1 consists of two helical resonators 2, 3 coupled to each other via an opening 4, each helical resonator being a quarter-wave length section of a shielding helical transmission line 8, grounded at one end 6 and open circuited at the other end 7. The helices 8 are formed by winding 24 gauge wire of enamelled copper on respective horizontal cylindrical formers 9a, 9b of low-loss thermoplastic. Each helix has 10 turns and is evenly distributed over the former in a single layer. A shielding pin 14 which is made of tin copper wire having a diameter of 1 mm is disposed between the helical resonators 2, 3 at a central position and is secured to a shield cover 10 and grounded to the circuit board 13. This shielding pin 14 is used to control the coupling between the resonators 2, 3 and in turn the frequency response of the filter section 1. In a further embodiment the filter section may comprise more than two helical resonators, wherein adjacent helical resonators have opposite winding directions, are grounded at opposing ends and have shielding pins located between them.

The cylindrical portion of each former 9a, 9b of the filter section 1 has a diameter of 5.5 mm and length of 10 mm, and is disposed with in the shield cover 10 so that its longitudinal axis is 5 mm from both the top and side wall of the shield with the longitudinal axes of the formers being 13 mm apart. The shield cover 10 is made of brass and is of a rectangular cross section of dimensions 10 mm×17 mm×23 mm with open ends 11, 12 and is attached and grounded to the circuit board 13. Experiments have shown that this shield cover does not adversely effect filter performance and there appears to be very little fringing field exterior to the shield cover and no detuning effects are apparent when operated in the presence of a overall housing.

Where the filter section 1 is electronically tuned with varicap diodes as in the case of the radio receiver front end as shown in FIG. 3, the initial fine tuning and alignment is achieved with copper or aluminium slugs (not shown) inserted into the high voltage ends of the coils, namely the open circuited ends. Preferably input and output coupling to the filter section is provided by taps, not shown, to the appropriate impedance points on the helical transmission lines. Alternatively the input and output coupling to the filter section may be provided by means of a probe or a loop in known manner.

In the filter sections shown in FIGS. 1A, 1B, 1C a "helical interdigital" coil structure is used which has been derived in part from the microwave stripline counterpart and the more conventional helical resonators. This "helical interdigital" coil structure is shown in FIG. 1C. The winding directions of these adjacent helices 8 are opposite, being clockwise on former 9a and anticlockwise on former 9b, and the helices 8 being grounded at ends 6 which oppose each other.

Figure 4:
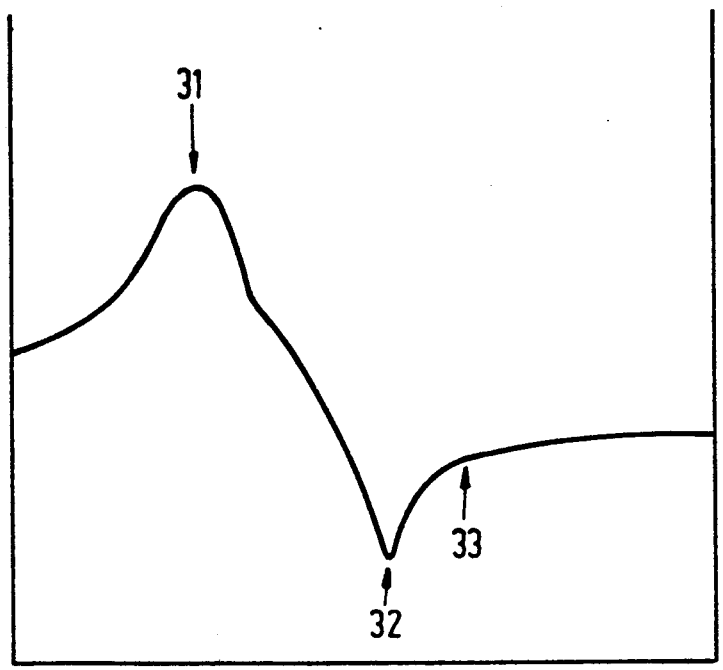
FIG. 4 is a diagram showing the response of the filter section shown in FIG. 1A. The filter section being electronically tuned in a manner as shown in FIG. 3.

The frequency response of the filter section 1 is shown in FIG. 4. This filter section has been electronically tuned to a centre frequency 31 of 174 MHz by a varicap diode network and has a transmission notch 32 at 203 MHz on the high frequency side of the centre frequency. This transmission notch is generated due to the nature of the coupling mechanism between the resonators 2,3 of the filter section 1, the helices winding direction and their orientation with respect to ground. The current magnitude in the loaded helical resonators reach a maximum at the grounded end 6 and the voltage reach a maximum at the open circuited end 7 which in the "interdigital helical" coil structure are opposing one another. As a consequence of this it is believed that an electric field coupling exists along almost the entire length of each winding with a concentration of magnetic field near the centre, whereby the electric and magnetic field components reinforce and a transmission notch is generated from the equivalent shunt LC coupling network. The coupling between the interdigital helical resonators is less tight than in conventional helical resonators and the use of partitions having openings are not needed. It has been found that by using one or more shielding pins 14 at particular locations between the helical resonators 2, 3 the transmission notch can be steered. For instance the locating of the grounded shielded pin at the centre between the helical resonators will decrease the transmission notch frequency, which appears to be the result of the mutual coupling being reduced by virtue of the shorted turn effect reflecting an increased inductance into each helical winding, which in turn raises the equivalent coupling inductance and lowers the transmission notch frequency. Alternatively one or more shielded pins 14 may be located between the helices at the ends of the resonators which raises the transmission notch frequency, which appears to be the result of the pins tending to increase the electric flux to ground and reducing the mutually coupled capacitance and thereby raising the transmission notch frequency. It has also been found that the pin diameter has a significant effect on coupling between the helices and a second order effect on the notch position wherein there is an optimal pin diameter for each band, however a pin diameter of 1 mm is suitable for all bands.

In the filter section shown in FIGS. 1A, 1B, 1C it has been found that by locating the shielded pin at the centre between the helical resonators 2, 3 the notch in the filter section response can be steered close to the image frequency of a radio receiver operating over the band (146 MHz–174 MHz) thereby gaining extra image rejection. This can be more clearly seen with reference to FIG. 4 where the filter section has been tuned to a centre frequency 31 of 174 MHz and the central location of the shielding pin causes a transmission notch 32 at 203 MHz which is close to the image frequency 33 of 217 MHz of the radio receiver. Whilst the transmission notch is lower than optimum, i.e. lower than the image frequency, it moves nearer to the image frequency as the filter is tuned down.

FIG. 3 shows a circuit diagram of a front end filter 15 for a radio receiver. The front end filter consists of two filter sections 16, 17 both of the same type as shown in FIGS. 1A, 1B, 1C. The RF signal is fed to input 18 of the front end filter 15 which is coupled to the tap 19 of the filter section 16, the output signal of filter section 16 is supplied by tap 20, and is fed to an RF amplifier 21 so that the S/N ratio of the signal does not significantly deteriorate beyond the amplifier, and this signal is fed to the tap 22 of filter section 17, the output signal of filter section 17 being supplied by tap 23 and fed to the output 24 of the front end filter 15 which is coupled to the mixer 25. In a further embodiment the front end filter may comprise one filter section and a RF amplifier coupled thereto, the output of the filter being taken from the output of the RF amplifier.

Figure 5:
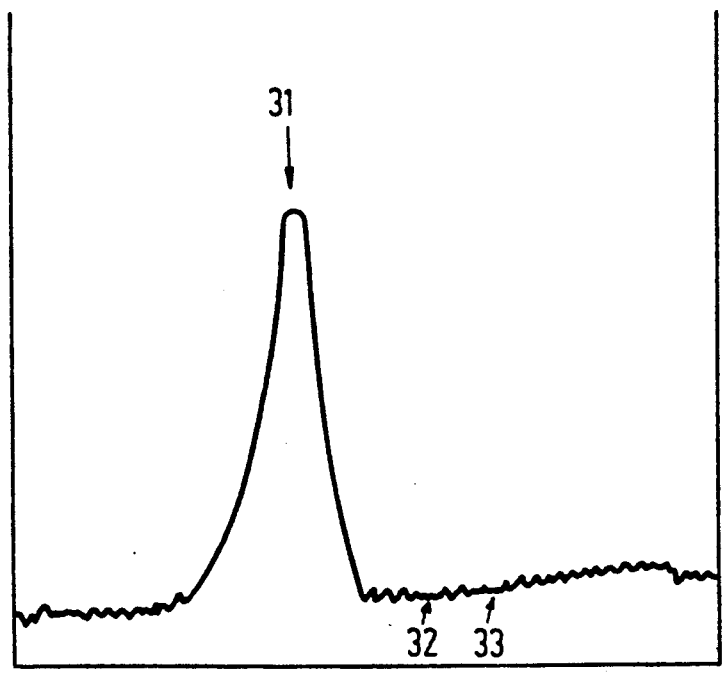
FIG. 5 is a diagram showing the response of the front-end filter as shown in FIG. 3.

The frequency response of the filter 15 when tuned to a centre frequency 31 of 174 MHz is illustrated in FIG. 5. The full rejection of the image frequency 33 of 217 MHz cannot be resolved without overloading the RF amplifier but is in principle greater than 85 dB over the full band (146–174 MHz). A front end filter using conventional helical resonators would require more resonators than the present filter in order to obtain image rejection specifications of 85 dB.

Each open circuited end 26 of the helices in the filter 15 is end loaded with a varicap diode network 27 which is used to electronically tune the filter 15 over the band (146–174 MHz) with a 1 db nose bandwidth of 4 MHz. The electronic tuning of the resonators is provided by the varicap diodes which are biased by an appropriate voltage supplied on a voltage source input 30. The capacitance end loading of the helices will lower the unloaded resonant frequency of the filter sections and is used to down tune the filter sections 16, 17 to the desired frequency in the band (146–174 MHz). Experiments have confirmed that the location of the transmission notch tracks closely to the passband when electronically tuned ensuring good image rejection over the tuning bandwidth. The unloaded resonant frequency of the filter sections 16, 17 may be chosen to be 2.4 to 2.8 times that of the top frequency in the band (146–174 MHz) which represents a good compromise between tuning range and insertion loss and the number of turns is then determined from the helical filter design equations of Zverev. The value of the total end loading capacitance C1 of the varicap diode network 27 necessary for a particular frequency in the band (146–174 MHz) is found from the following semi-empirical equation:

$$C1 = [14.2 * \pi * Z_0 * (f1^2/fu) * \tan(\pi/2 * f1/fu)]^{-1}$$

where
fu = unloaded resonator frequency
f1 = loaded resonator frequency
Z0 = resonator characteristic impedance.

The varicap diode network 27 is used to minimize intermodulation distortion and four varicap diodes 28 are used to limit the insertion loss of the filter section to less than 2.5 dB with a typical 1 dB nose bandwidth of 5 MHz. The value of capacitance of the capacitor 29 and varicap diodes 28 in series with the open circuited end 26 of the helix is set in conjunction with the varicap tuning range and the number of turns of the helix to cover the desired band. Fine tuning is achieved with copper or aluminium tuning slugs.

The tap point on each helix is chosen to be at ⅜ of a turn for the band (146–174 MHz). This was chosen to be compatible with the type of horizontal formers 9a,9b used and any mismatch in impedance may be accounted for by a capacitor divider network in known manner (not shown).

The insertion loss of a filter of this type increases when the open circuited end 26 of the resonator is taken to a circuit board pad connection. This is due to losses within the circuit board itself and is reduced in this application by relieving the ground plane area underneath the end connection of the helix.

A further embodiment of a filter section which is suitable for operation over the band (68–88 MHz) is shown in FIG. 2. It has been found that the transmission notch associated with a single central pin has dropped too low to be effective in image rejection in this band. In this embodiment the transmission notch is raised by using two edge pins in lieu of one central pin, a common shield cover 10 is used with provision for both pin locations.

As will be apparent from the foregoing various modifications to the above embodiments are possible without departing from the scope of the invention, which applies in particular to the use of the filter in RF applications other than front end filters where similar attenuation requirements may be required.

I claim:

1. A radio receiver comprising a filter having one or more filter sections, each filter section comprising: a shield having therein a plurality of helical resonators each having a quarter-wavelength transmission line wound in the form of a helix with the transmission lines of adjacent resonators being wound in opposite directions and being grounded at opposite ends, such that the frequency response of the filter section has a transmission notch on the high frequency side of the filter section passband; and one or more grounded shielding pins disposed between adjacent helical resonators at such locations that the transmission notch in the frequency response of the filter section is steered to be coincident with or near to the image frequency.

2. A radio receiver as claimed in claim 1, wherein the filter comprises two said filter sections, the output of one being coupled to the input of the other, and each filter section having two said helical resonators.

3. A radio receiver as claimed in claim 2, wherein each of the filter sections comprises one shielding pin which is disposed between said adjacent helical resonators at a central location.

4. A radio receiver as claimed in claim 2, wherein each of the filter sections comprises two shielding pins which are disposed between said adjacent helical resonators, the shielding pins being located at opposite ends of the adjacent resonators.

5. A radio receiver as claimed in claim 2, wherein the output of one said filter section is coupled to the input of the other said filter section via an amplifier.

6. A radio receiver as claimed in claim 1, wherein the grounded end of each of the helical resonators is coupled to a varicap diode network whereby the filter can be electronically tuned.

7. A radio receiver as claimed in claim 3, wherein the output of one said filter section is coupled to the input of the other said filter section via an amplifier.

8. A radio receiver as claimed in claim 7, wherein the grounded end of each of the helical resonators are coupled to a varicap diode network whereby the filter can be electronically tuned.

9. A radio receiver as claimed in claim 2, wherein the grounded end of each of the helical resonators is coupled to a varicap diode network whereby the filter can be electronically tuned.

10. A radio receiver as claimed in claim 3, wherein the grounded end of each of the helical resonators is coupled to a varicap diode network whereby the filter can be electronically tuned.

11. A radio receiver as claimed in claim 4, wherein the grounded end of each of the helical resonators is coupled to a varicap diode network whereby the filter can be electronically tuned.

12. A radio receiver as claimed in claim 5, wherein the grounded end of each of the helical resonators is coupled to a varicap diode network whereby the filter can be electronically tuned.

13. A filter for use in a radio apparatus, wherein the filter has one or more filter sections, each filter section comprising: a shield having therein a plurality of helical resonators each having a quarter-wavelength transmission line wound in the form of helix with the transmission lines of adjacent resonators being wound in opposite directions and being grounded at opposite ends, such that the frequency response of the filter section has a transmission notch on the high frequency side of the filter section passband; and one or more grounded shielding pins disposed between adjacent helical resonators at such locations that the transmission notch in the frequency response of the filter section is steered to be coincident with or near to the image frequency.

14. A filter as claimed in claim 13, wherein each of the filter sections comprises one shielding pin which is disposed between said adjacent helical resonators at a central location.

15. A filter as claimed in claim 13, wherein each of the filter sections comprises two shielding pins which are disposed between said adjacent helical resonators, the shielding pins being located at opposite ends of the adjacent resonators.

16. A filter as claimed in any one of the claims 13 to 15, wherein the grounded end of each of the helical resonators is coupled to a varicap diode network whereby the filter can be electronically tuned.

* * * * *